United States Patent
Seshita et al.

(10) Patent No.: US 7,148,737 B2
(45) Date of Patent: Dec. 12, 2006

(54) SEMICONDUCTOR SWITCHING CIRCUIT

(75) Inventors: Toshiki Seshita, Kanagawa (JP); Yoshitomo Sagae, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 11/142,455

(22) Filed: Jun. 2, 2005

(65) Prior Publication Data
US 2006/0082408 A1    Apr. 20, 2006

(30) Foreign Application Priority Data
Oct. 19, 2004    (JP)    .............................. 2004-304350

(51) Int. Cl.
*H03K 17/687*    (2006.01)
(52) U.S. Cl. .................. 327/427; 327/407; 327/408; 327/415; 327/430; 327/434
(58) Field of Classification Search .................. None
See application file for complete search history.

(56) References Cited
U.S. PATENT DOCUMENTS
4,521,810 A * 6/1985 Nigborowicz et al. ...... 348/706

| | | | | |
|---|---|---|---|---|
| 5,350,957 A | * | 9/1994 | Cooper et al. | 327/427 |
| 5,969,560 A | * | 10/1999 | Kohama et al. | 327/427 |
| 2002/0063457 A1 | * | 5/2002 | Hsia | 297/271.6 |
| 2006/0181328 A1 | * | 8/2006 | Nakatsuka et al. | 327/404 |

FOREIGN PATENT DOCUMENTS

| | | |
|---|---|---|
| JP | 8-223021 | 8/1996 |
| JP | 9-284170 | 10/1997 |
| JP | 2000-68807 | 3/2000 |

* cited by examiner

*Primary Examiner*—Quan Tra
*Assistant Examiner*—Khareem E. Almo
(74) *Attorney, Agent, or Firm*—Oblon, Spivak, McClelland, Maier & Neustadt, P.C.

(57) ABSTRACT

The invention discloses a semiconductor switching circuit suitable for a Single Pole n Throw (SPnT) switching circuit having: a common terminal; first through third terminals, ground and control terminals, through FETS, shunt FETs, wherein when a first electric potential is supplied only to a Jth control terminal, and a second lower electric potential is supplied to the other control terminals, the common and Jth terminals are electrically connected and the first through third terminals are electrically disconnected.

16 Claims, 7 Drawing Sheets

SEMICONDUCTOR SWITCHING CIRCUIT

CROSS REFERENCE TO RELATED APPLICATION

This application is based upon and claims benefit of priority under 35 USC §119 from the Japanese Patent Application No. 2004-304350, filed on Oct. 19, 2004, the entire contents of which are incorporated herein by reference.

BACKGROUND OF THE INVENTION

The present invention relates to a semiconductor switching circuit and, more particularly, to a semiconductor switching circuit suited for, e.g., an SPnT (Single-Pole n-Throw) switching circuit.

For example, an SP3T switch is widely used as a switch for switching transmission and reception of radio-frequency signals by a single antenna in a cellphone.

This radio-frequency switch of 1 GHz or more is in many cases made of a compound semiconductor such as GaAs having high electron mobility and excellent characteristics in a radio-frequency region.

Unfortunately, a P-channel FET is difficult to realize by the compound semiconductor. Therefore, when logic circuits necessary to control switching are to be fabricated by using OR circuits, they are fabricated by using, e.g., N-channel FETs alone, N-channel FETs and resistors, or N-channel FETs and diodes. In any case, current consumption occurs in a standby state.

If it is necessary to reduce this current consumption in the standby state to zero, the logic circuits must be fabricated by using externally attached CMOS circuits. In this case, however, six control terminals are necessary.

This increases the number of pads and inevitably increases the chip size. The increase in chip size is a fatal problem in a switching IC which is severely required to reduce the fabrication cost.

Also, it is necessary to form many interconnections on a packaging substrate, and form an additional logic IC for control. This increases both the packaging area and cost.

The conventional SP3T switch, therefore, must incorporate OR circuits, and this increases the current consumption.

As described above, it is difficult for the conventional shunt type SP3T switch to decrease the number of control terminals to three or less and at the same time reduce the current consumption in the standby state.

A reference disclosing the conventional semiconductor switching circuit is as follows.

Japanese Patent Laid-Open No. 2000-68807

SUMMARY OF THE INVENTION

According to one of the present invention, there is provided a semiconductor switching circuit comprising:

a common terminal;

first, second, and third terminals;

first, second, and third ground terminals;

first, second, and third control terminals;

a first through FET having a source and drain connected in series between said common terminal and first terminal, and a gate connected to said first control terminal via a first resistor;

a second through FET having a source and drain connected in series between said common terminal and second terminal, and a gate connected to said second control terminal via a second resistor;

a third through FET having a source and drain connected in series between said common terminal and third terminal, and a gate connected to said third control terminal via a third resistor;

11th and 12th shunt FETs each having a source and drain connected in parallel between said first terminal and first ground terminal;

21st and 22nd shunt FETs each having a source and drain connected in parallel between said second terminal and second ground terminal; and 31st and 32nd shunt FETs each having a source and drain connected in parallel between said third terminal and third ground terminal, wherein gates of said 11th and 22nd shunt FETs are connected to said third control terminal via 11th and 22nd resistors, respectively, gates of said 21st and 31st shunt FETs are connected to said first control terminal via 21st and 31st resistors, respectively, gates of said 12th and 32nd shunt FETs are connected to said second control terminal via 12th and 32nd resistors, respectively, and when a first electric potential is supplied only to a Jth (J is a natural number of 1 to 3) control terminal, and a second electric potential lower than the first electric potential is supplied to the rest of said control terminals, said common terminal and a Jth terminal are electrically connected, and said first to third terminals except for said Jth terminal and said common terminal are electrically disconnected.

According to one of the present invention, there is provided a semiconductor switching circuit comprising:

a common terminal;

first, second, jth (j is an integer of 3 to n−1), and nth (n is an integer of not less than 3) terminals;

first, second, jth, and nth ground terminals;

first, second, jth, and nth control terminals;

a first through FET having a source and drain connected in series between said common terminal and first terminal, and a gate connected to said first control terminal via a first resistor;

a second through FET having a source and drain connected in series between said common terminal and second terminal, and a gate connected to said second control terminal via a second resistor;

a jth through FET having a source and drain connected in series between said common terminal and jth terminal, and a gate connected to said jth control terminal via a jth resistor;

an nth through FET having a source and drain connected in series between said common terminal and nth terminal, and a gate connected to said nth control terminal via an nth resistor;

11th, 12th, (1j)th, and (1(n−1))th shunt FETs each having a source and drain connected in parallel between said first terminal and first ground terminal;

21st, 22nd, (2j)th, and (2(n−1))th shunt FETs each having a source and drain connected in parallel between said second terminal and second ground terminal;

(j1)th, (j2)th, (jj)th, and (j(j−1))th FETs each having a source and drain connected in parallel between said jth terminal and jth ground terminal; and
}

(n1)th, (n2)th, (nj)th, and (n(n−1))th FETs each having a source and drain connected in parallel between said nth terminal and nth ground terminal, wherein gates of said 11th to (1(n−1))th shunt FETs are connected to said second to nth control terminals except for said first control terminal via 11th to (1(n−1))th resistors, respectively, gates of said 21st to (2(n−1))th shunt FETs are connected to said first and third to nth control terminals except for said second control terminal via 21st to (2(n−1))th resistors, respectively, gates of said (n1)th to (n(n−1))th shunt FETs are connected to said first to (n−1)th control terminals except for said nth control terminal via (n1)th to (n(n−1))th resistors, respectively, and when a first electric potential is supplied only to a kth (k is an integer of 1 to n) control terminal, and a second electric potential lower than the first electric potential is supplied to the rest of said control terminals, said common terminal and a kth terminal are electrically connected, and said first to nth terminals except for said kth terminal and said common terminal are electrically disconnected.

DETAILED DESCRIPTION OF THE INVENTION

Semiconductor switching circuits according to embodiments of the present invention will be described below with reference to the accompanying drawing.

(1) First Embodiment

Figure 1:
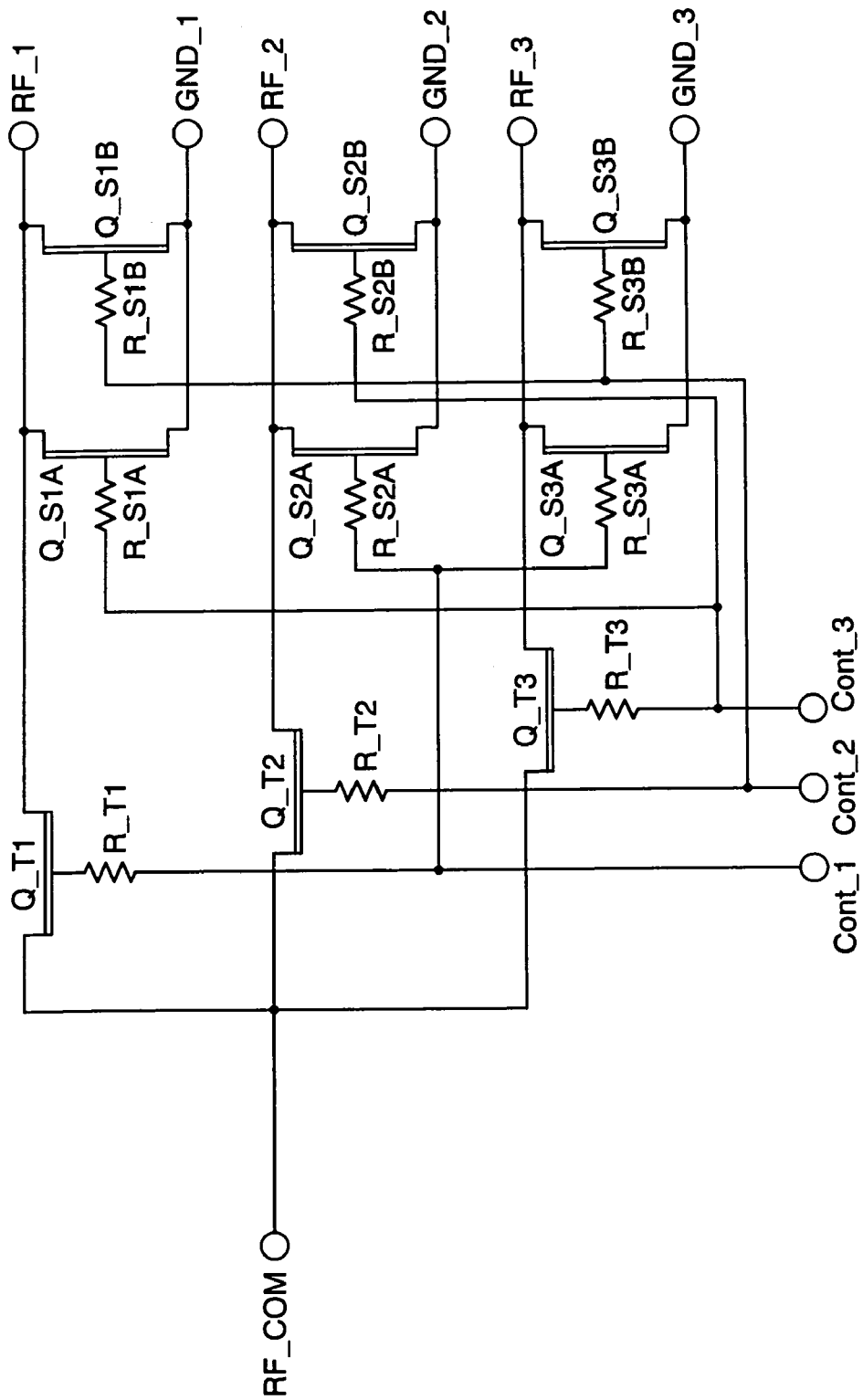
FIG. 1 is a circuit diagram showing the arrangement of a semiconductor switching circuit according to the first embodiment of the present invention.

The first embodiment as shown in FIG. 1 comprises one common radio-frequency signal terminal RF_COM, three radio-frequency signal terminals RF_1, RF_2, and RF_3, three control terminals Cont_1, Cont_2, and Cont_3, three radio-frequency ground terminals GND_1, GND_2, and GND_3, three through FETs Q_T1, Q_T2, and Q_T3, three shunt FETs Q_S1A, Q_S2A, and Q_S3A, three shunt FETs Q_S1B, Q_S2B, and Q_S3B, three resistors R_T1, R_T2, and R_T3, three resistors R_S1A, R_S2A, and R_S3A, and three resistors R_S1B, R_S2B, and R_S3B.

The above circuit elements are connected as follows.

The drains and sources of the through FETs Q_T1, Q_T2, and Q_T3 are connected in series between the terminal RF_COM and terminal RF_1, between the terminal RF_COM and terminal RF_2, and between the terminal RF_COM and terminal RF_3, respectively. The gates of the through FETs Q_T1, Q_T2, and Q_T3 are connected to the control terminals Cont_1, Cont_2, and Cont_3 via the high resistors R_T1, R_T2, and R_T3, respectively.

The drains and sources of the shunt FETs Q_S1A, Q_S2A, and Q_S3A are connected in series between the terminal RF_1 and ground terminal GND_1, between the terminal RF_2 and ground terminal GND_2, and between the terminal RF_3 and ground terminal GND_3, respectively.

The drains and sources of the shunt FETs Q_S1B, Q_S2B, and Q_S3B are connected in series between the terminal RF_1 and ground terminal GND_1, between the terminal RF_2 and ground terminal GND_2, and between the terminal RF_3 and ground terminal GND_3, in parallel with the shunt FETs Q_S1A, Q_S2A, and Q_S3A, respectively.

The gates of the shunt FETs Q_S1A, Q_S2A, and Q_S3A are connected to the control terminals Cont_3, Cont_1, and Cont_1 via the high resistors R_S1A, R_S2A, and R_S3A, respectively.

The gates of the shunt FETs Q_S1B, Q_S2B, and Q_S3B are connected to the control terminals Cont_2, Cont_3, and Cont_2 via the high resistors R_S1B, R_S2B, and R_S3B, respectively.

In the first embodiment as described above, the paired shunt FETs Q_S1A and Q_S1B, Q_S2A and Q_S2B, and Q_S3A and Q_S3B are connected in parallel between the terminal RF_1 and ground terminal GND_1, between the terminal RF_2 and ground terminal GND_2, and between the terminal RF_3 and ground terminal GND_3, respectively.

The following three modes can be switched by the electric potentials of the control terminals Cont_1, Cont_2, and Cont_3.

(A) When the control terminals are Cont_1=high level, Cont_2=low level, and Cont_3=low level;

the FETs Q_T1, Q_S2A, and Q_S3A are ON, and the FETs Q_T2, Q_T3, Q_S1A, Q_S1B, Q_S2B and Q_S3B are OFF.

Accordingly, the terminals RF_COM and RF_1 are electrically connected, and the terminals RF_COM and RF_2 and the terminals RF_COM and RF_3 are electrically disconnected.

(B) When the control terminals are Cont_2=high level, Cont_1=low level, and Cont_3=low level;

the FETs Q_T2, Q_S1B, and Q_S3B are ON, and the FETs Q_T1, Q_T3, Q_S2A, Q_S2B, Q_S1A and Q_S3A are OFF.

Accordingly, the terminals RF_COM and RF_2 are electrically connected, and the terminals RF_COM and RF_1 and the terminals RF_COM and RF_3 are electrically disconnected.

(C) When the control terminals are Cont_3=high level, Cont_1=low level, and Cont_2=low level;

the FETs Q_T3, Q_S1A, and Q_S2B are ON, and the FETs Q_T1, Q_T2, Q_S3A, Q_S3B, Q_S1B and Q_S2A are OFF.

In this state, the terminals RF_COM and RF_3 are electrically connected, and the terminals RF_COM and RF_1 and the terminals RF_COM and RF_2 are electrically disconnected.

As described above, in the electrically disconnected state, the through FETs are OFF, and the shunt FETs are ON. This increases the isolation between two terminals.

The resistor connected to the gate of each FET has a resistance value high enough to prevent a leak of RF signals. That terminal of each resistor, which is not connected to the gate is connected to the control terminal so as to implement the above function.

Also, the ground terminals GND_1, GND_2, and GND_3 are desirably so grounded that when this embodiment is formed into a chip, no RF signals leak outside the chip.

When the above circuit is produced, the ground terminals GND_1, GND_2, and GND_3 are connected to external terminals by bonding wires. These bonding wires have parasitic inductances and hence are not completely grounded. Therefore, if these three ground terminals are bound in the integrated circuit, RF signals may leak through the path to deteriorate the isolation characteristics between the terminals RF_1, RF_2, and RF_3.

Accordingly, as described above, it is important that the shunt FET pairs, i.e., the FETs Q_S1A and Q_S1B, Q_S2A and Q_S2B, and Q_S3A and Q_S3B are connected to the independent ground terminals GND_1, GND_2, and GND_3 for RF signals.

Note that if the ground terminals GND_1, GND_2, and GND_3 can be regarded as ideal RF signal compatible ground terminals owing to bump packaging or the like, these ground terminals may also be connected together in the integrated circuit.

In the first embodiment, an SP3T switch can be implemented only with three control terminals although practically no control circuit formed by, e.g., logic circuits requiring current consumption exits.

Note that current consumption occurs only when a reverse leakage current is produced in the gate of the FET. However, a current value in this case is extremely small and practically almost negligible. Therefore, it is possible to implement an SP3T having practically zero current consumption.

Figure 2:
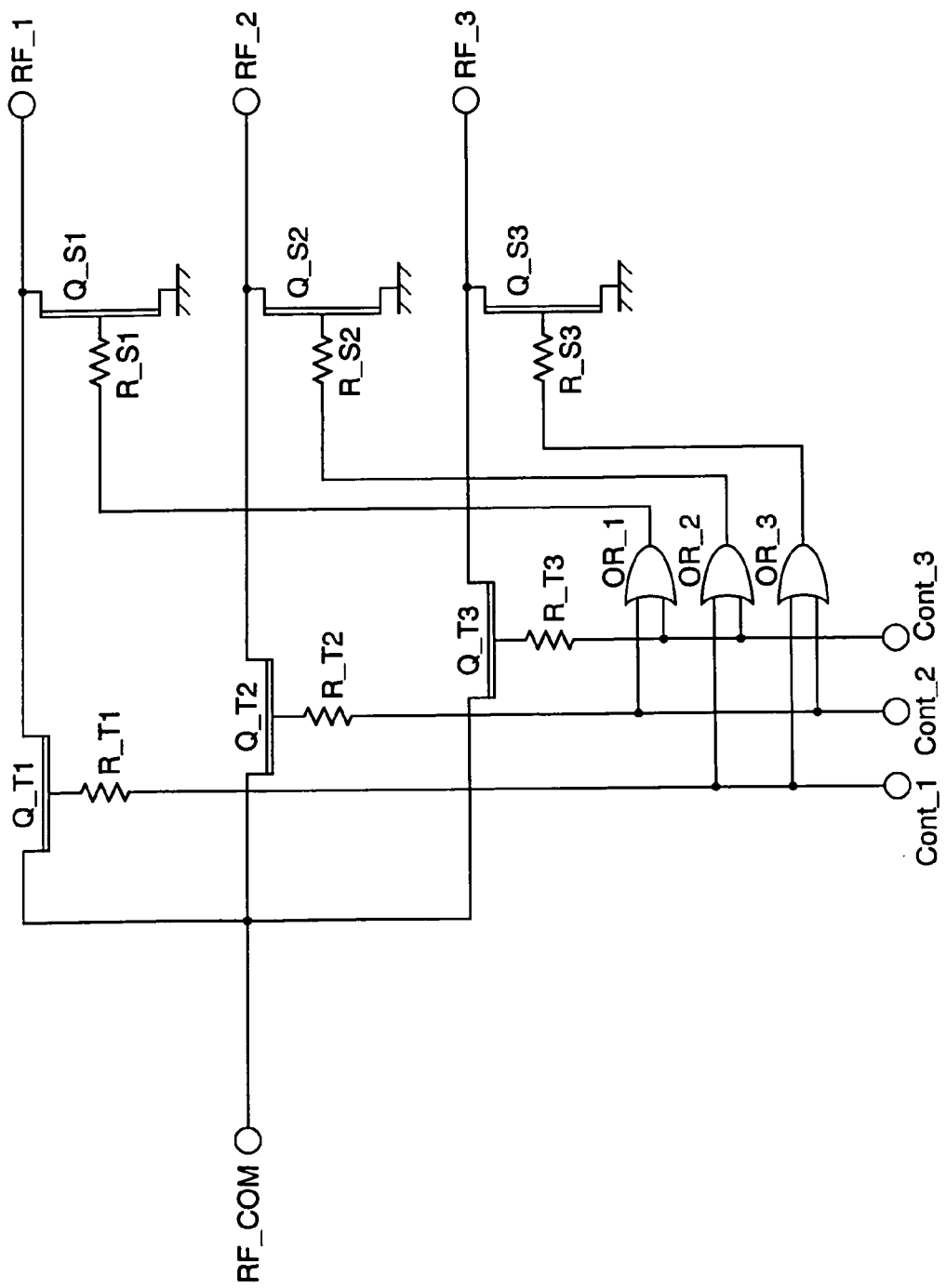
FIG. 2 is a circuit diagram showing the arrangement of a semiconductor switching circuit according to a comparative example.

FIG. 2 shows the arrangement of an SP3T switch as a comparative example of the first embodiment described above.

In this comparative example, unlike in the first embodiment, shunt FETs Q_S1, Q_S2, and Q_S3 are connected between terminals RF_1, RF_2, and RF_3, respectively, and common ground terminal connected to them.

Instead of the shunt FET pairs in the first embodiment, three two-input OR circuits are used as control circuits. That is, OR circuits OR_1, OR_2, and OR_3 are formed between through FETs Q_T1, Q_T2, and Q_T3 and the shunt FETs Q_S1, Q_S2, and Q_S3, respectively.

For example, when control terminals Cont_1, Cont_2, and Cont_3 are high level, low level, and low level, respectively, the FETs Q_T1, Q_S2, and Q_S3 are ON, and the FETs Q_T2, Q_T3, and Q_S1 are OFF.

Consequently, only a terminal RF_COM and the terminal RF_1 are electrically connected, and the terminals RF_COM and RF_2 and the terminals RF_COM and RF_3 are electrically disconnected.

In this comparative example as described above, logic circuits necessary to control switching are fabricated by using OR circuits, and these OR circuits are formed by externally attached CMOS circuits in order to prevent current consumption in a standby state. However, as described previously, at least six control terminals are required, and this increases the chip size and cost.

By contrast, the first embodiment can prevent the increase in number of control terminals, and reduce the current consumption in the standby state to practically zero.

(2) Second Embodiment

Figure 3:
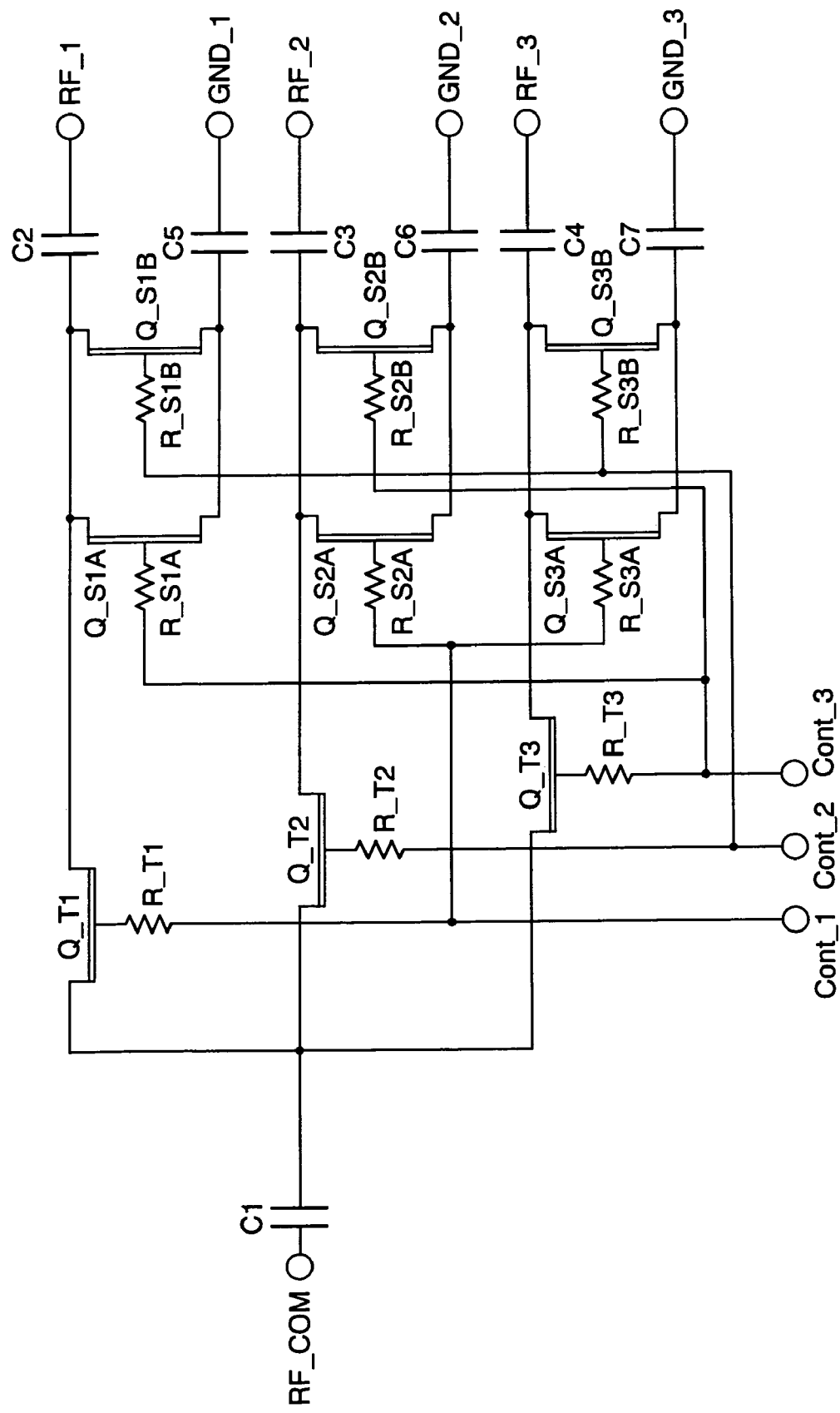
FIG. 3 is a circuit diagram showing the arrangement of a semiconductor switching circuit according to the second embodiment of the present invention.

FIG. 3 shows the arrangement of an SP3T switch according to the second embodiment of the present invention.

The second embodiment differs from the first embodiment in that a capacitor C1 for removing the DC component is connected between a terminal CF_COM and the ends on one side of through FETs Q_T1 to Q_T3, and capacitors C2 to C7 for removing the DC component are connected between terminals RF_1 to RF_3 and GND_1 to GND_3 and shunt FETs Q_S1B to Q_S3B connected to these terminals.

As explained in the first embodiment, a shunt FET Q_S1A and the shunt FET Q_S1B, a shunt FET Q_S2A and the shunt FET Q_S2B, and a shunt FET Q_S3A and the shunt FET Q_S3B are connected in parallel between the terminal RF_1 and ground terminal GND_1, the terminal RF_2 and ground terminal GND_2, and the terminal RF_3 and ground terminal GND_3, respectively. What is important is that the capacitors C2 to C7 are formed independently of each other between the terminals RF_1 to RF_3 and GND_1 and GND_3 and the shunt FETs Q_S1B to Q_S3B connected to these terminals. Accordingly, the RF characteristics can be improved by removing the DC component for each terminal.

Since these capacitors for removing the DC component are necessary, they are formed outside the integrated circuit in the first embodiment. In the second embodiment, the capacitors C1 to C7 are formed inside the circuit, so no capacitors need be externally connected. This helps reduce the device area and cost.

Note that practical materials of the capacitors C1 to C7 are not particularly limited. However, if MIM (Metal-Insulator-Metal) capacitors are used, the value of the capacitance can be accurately set.

This makes it possible to accurately adjust the capacitance value to a value which causes series resonance at a desired frequency with respect to the series parasitic inductance, such as a bonding wire, of an enclosure. As a consequence, the characteristics of an SP3T switch can be well achieved.

(3) Third Embodiment

Figure 4:
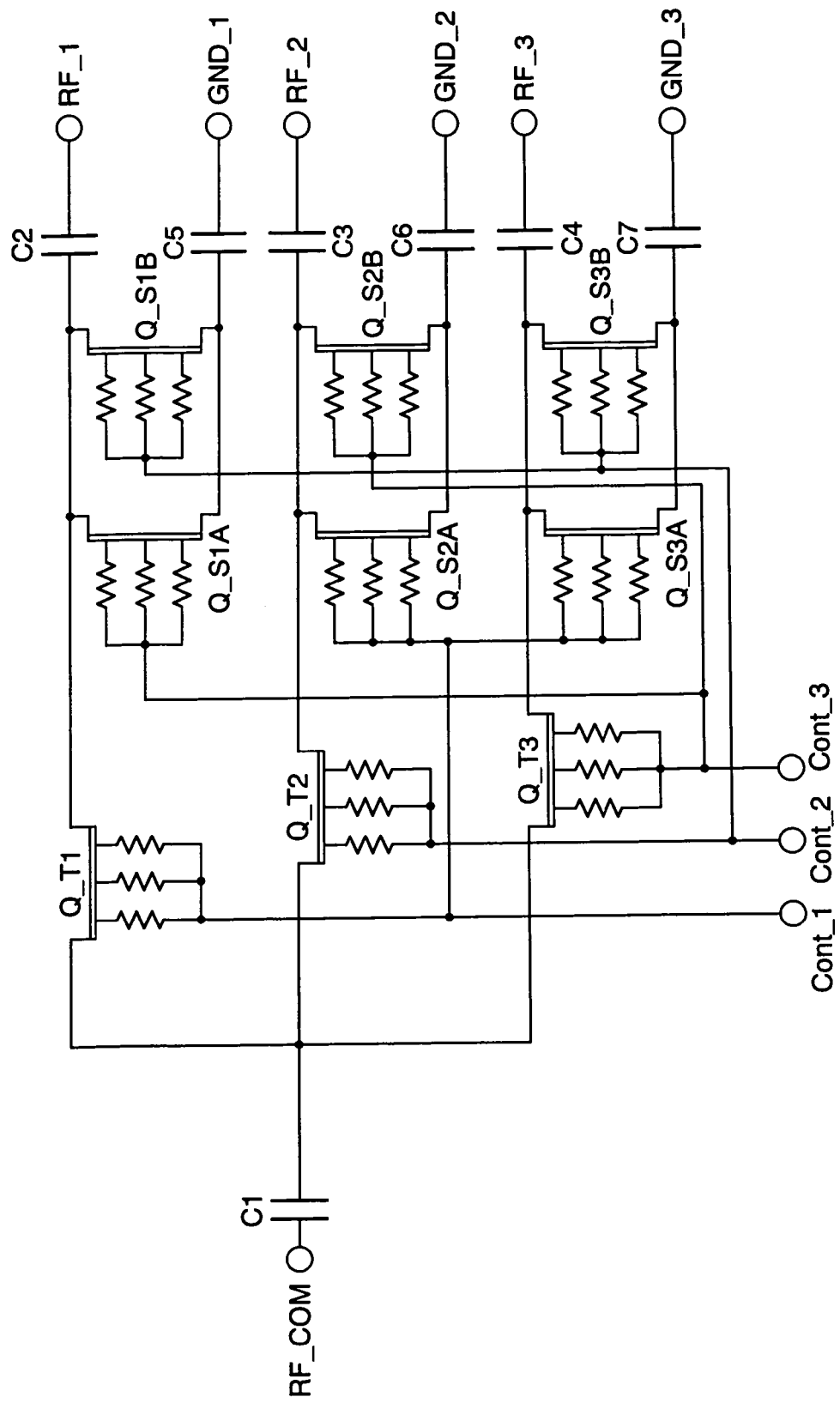
FIG. 4 is a circuit diagram showing the arrangement of a semiconductor switching circuit according to the third embodiment of the present invention.

FIG. 4 shows the arrangement of an SP3T switch according to the third embodiment of the present invention.

In the second embodiment, the through FETs Q_T1 to Q_T3 ad the shunt FETs Q_S1A to Q_S3A and Q_S1B to Q_S3B are single-gate FETs. The third embodiment differs from the second embodiment in that all these FETs are multi-gate FETs.

Although FETs shown in FIG. 4 are triple-gate FETs, any FETs having two or more gates can be used.

In the third embodiment as described above, the use of the multi-gate FETs increases the maximum allowable input power. The rest of the arrangement and the effects of this embodiment are the same as the second embodiment, so an explanation thereof will be omitted.

(4) Fourth Embodiment

Figure 5:
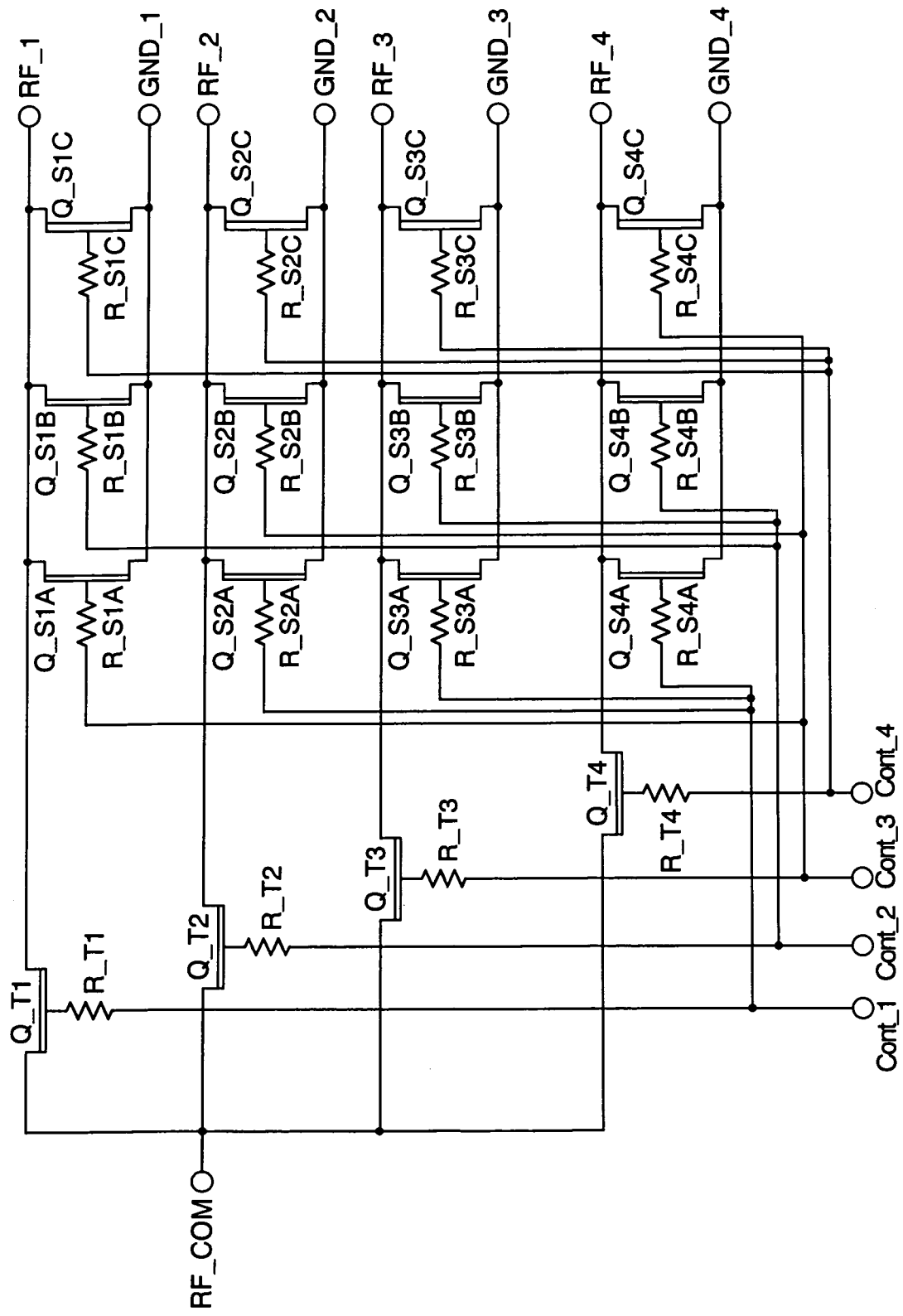
FIG. 5 is a circuit diagram showing the arrangement of a semiconductor switching circuit according to the fourth embodiment of the present invention.

The fourth embodiment is equivalent to applying the arrangement of the SP3T switch according to the second embodiment to an SP4T switch. FIG. 5 shows the arrangement of the fourth embodiment.

The drains and sources of through FETs Q_T1, Q_T2, Q_T3, and Q_T4 are connected in series between a terminal RF_COM and a terminal RF_1, between the terminal RF_COM and a terminal RF_2, between the terminal RF_COM and a terminal RF_3, between the terminal RF_COM and a terminal and RF_4, respectively. The gates of the through FETs Q_T1, Q_T2, Q_T3, and Q_T4 are connected to control terminals Cont_1, Cont_2, Cont_3, and Cont_4 via high resistors R_T1, R_T2, R_T3, and R_T4, respectively.

The drains and sources of shunt FETs Q_S1A, Q_S2A, Q_S3A, and Q_S4A are connected in series between the terminal RF_1 and a ground terminal GND_1, the terminal RF_2 and a ground terminal GND_2, the terminal RF_3 and a ground terminal GND_3, and the terminal RF_4 and a ground terminal GND_4, respectively.

The drains and sources of shunt FETs Q_S1B, Q_S2B, Q_S3B, and Q_S4B are connected in series between the terminal RF_1 and ground terminal GND_1, the terminal RF_2 and ground terminal GND_2, the terminal RF_3 and ground terminal GND_3, and the terminal RF_4 and ground terminal GND_4, in parallel with the shunt FETs Q_S1A, Q_S2A, Q_S3A, and Q_S4A, respectively.

The drains and sources of shunt FETs Q_S1C, Q_S2C, Q_S3C, and Q_S4C are connected in series between the terminal RF_1 and ground terminal GND_1, the terminal RF_2 and ground terminal GND_2, the terminal RF_3 and ground terminal GND_3, and the terminal RF_4 and ground terminal GND_4, in parallel with the shunt FETs Q_S1A and Q_S1B, Q_S2A and Q_S2B, Q_S3A and Q_S3B, and Q_S4A and Q_S4B, respectively.

The gates of the shunt FETs Q_S1A, Q_S2A, Q_S3A, and Q_S4A are connected to the control terminals Cont_3, Cont_1, Cont_1, and Cont_1 via high resistors R_S1A, R_S2A, R_S3A, and R_S4A, respectively.

The gates of the shunt FETs Q_S1B, Q_S2B, Q_S3B, and Q_S4B are connected to the control terminals Cont_2, Cont_3, Cont_2, and Cont_2 via high resistors R_S1B, R_S2B, R_S3B, and R_S4B, respectively.

The gates of the shunt FETs Q_S1C, Q_S2C, Q_S3C, and Q_S4C are connected to the control terminals Cont_4, Cont_4, Cont_4, and Cont_3 via high resistors R_S1C, R_S2C, R_S3C, and R_S4C, respectively.

In the fourth embodiment as described above, the shunt FETs Q_S1A, Q_S1B, and Q_S1C, Q_S2A, Q_S2B, and Q_S2C, and Q_S3A, Q_S3B, and Q_S3C are connected in parallel between the terminal RF_1 and ground terminal GND_1, terminal RF_2 and ground terminal GND_2, and terminal RF_3 and ground terminal GND_3, and terminal RF_4 and ground terminal GND_4, respectively.

The following four modes can be switched by the electric potentials of the control terminals Cont_1, Cont_2, Cont_3, and Cont_4.

(A) When the control terminals are Cont_1=high level, Cont_2=low level, Cont_3=low level, and Cont_4=low level;

the FETs Q_T1, Q_S2A, Q_S3A, and Q_S4A are ON, and the FETs Q_T2, Q_T3, Q_T4, Q_S1A, Q_S1B, Q_S1C, Q_S2B, Q_S2C, Q_S3B, Q_S3C, Q_S4B and Q_S4C are OFF.

Accordingly, the terminals RF_COM and RF_1 are electrically connected, and the terminals RF_COM and RF_2, the terminals RF_COM and RF_3, and the terminals RF_COM and RF_4 are electrically disconnected.

(B) When the control terminals are Cont_2=high level, Cont_1=low level, Cont_3=low level, and Cont_4=low level;

the FETs Q_T2, Q_S1B, Q_S3B, and Q_S4B are ON, and the FETs Q_T1, Q_T3, Q_T4, Q_S2A, Q_S2B, Q_S2C, Q_S1A, Q_S1C, Q_S3A, Q_S3C, Q_S4A and Q_S4C are OFF.

Accordingly, the terminals RF_COM and RF_2 are electrically connected, and the terminals RF_COM and RF_1, the terminals RF_COM and RF_3, and the terminals RF_COM and RF_4 are electrically disconnected.

(C) When the control terminals are Cont_3=high level, Cont_1=low level, Cont_2=low level, and Cont_4=low level;

the FETs Q_T3, Q_S1A, Q_S2B, and Q_S4C are ON, and the FETs Q_T1, Q_T2, Q_T4, Q_S3A, Q_S3B, Q_S3C, Q_S1B, Q_S1C, Q_S2A, Q_S2C, Q_S4A and Q_S4B are OFF.

Accordingly, the terminals RF_COM and RF_3 are electrically connected, and the terminals RF_COM and RF_1, the terminals RF_COM and RF_2, and the terminals RF_COM and RF_4 are electrically disconnected.

(D) When the control terminals are Cont_4=high level, Cont_1=low level, Cont_2=low level, and Cont_3=low level;

the FETs Q_T4, Q_S1C, Q_S2C, and Q_S3C are ON, and the FETs Q_T1, Q_T2, Q_T3, Q_S4A, Q_S4B, Q_S4C, Q_S1A, Q_S1B, Q_S2A, Q_S2B, Q_S3A and Q_S3B are OFF.

In this case, the terminals RF_COM and RF_4 are electrically connected, and the terminals RF_COM and RF_1, the terminals RF_COM and RF_2, and the terminals RF_COM and RF_3 are electrically disconnected.

As in the first to third embodiments described above, the resistors R_T1 to R_T4, R_S1A to R_S4A, R_S1B to R_S4B, and R_S1C to R_S4C connected to the gates of the FETs each have a resistance value high enough to prevent a leak of RF signals. Also, that terminal of each resistor, which is not connected to the gate of any FET is connected to one of the control terminals Cont_1 to Cont_4 so as to implement the above switching function.

Note that as in the first to third embodiments, the ground terminals GND_1 to GND_4 are desirably so grounded that no RF signals leak outside the integrated circuit.

Note also that it is important that the four shunt FET sets, i.e., the FETs Q_S1A to Q_S1C, Q_S2A to Q_S2C, Q_S3A to Q_S3C, and Q_S4A to S4C are independently connected to the different ground terminals GND_1, GND_2, GND_3, and GND_4, respectively, in order to improve the RF characteristics.

The circuit of this embodiment can implement an SP4T switch by using only four control terminals without any control circuits formed by, e.g., logic circuits which consume electric currents. That is, the semiconductor switching circuit of this embodiment can reduce the current consumption in the standby state without increasing the number of control terminals.

In the arrangement shown in FIG. 5, no capacitor for removing the DC component is formed, and each FET has a single-gate structure.

It is, however, also possible to form capacitors as in the second or third embodiment, or use FETs having a multi-gate structure as in the third embodiment.

The above embodiments are merely examples and can be modified within the technical scope of the present invention.

For example, although the present invention is applied to an SP3T switch in each of the first to third embodiments and an SP4T switch in the fourth embodiment, it is also applicable to an SPnT switch (n is a natural number of 3 or more).

In addition, as described previously, the present invention can implement an SPnT switch by using n control terminals without any logic circuit.

Figure 6:
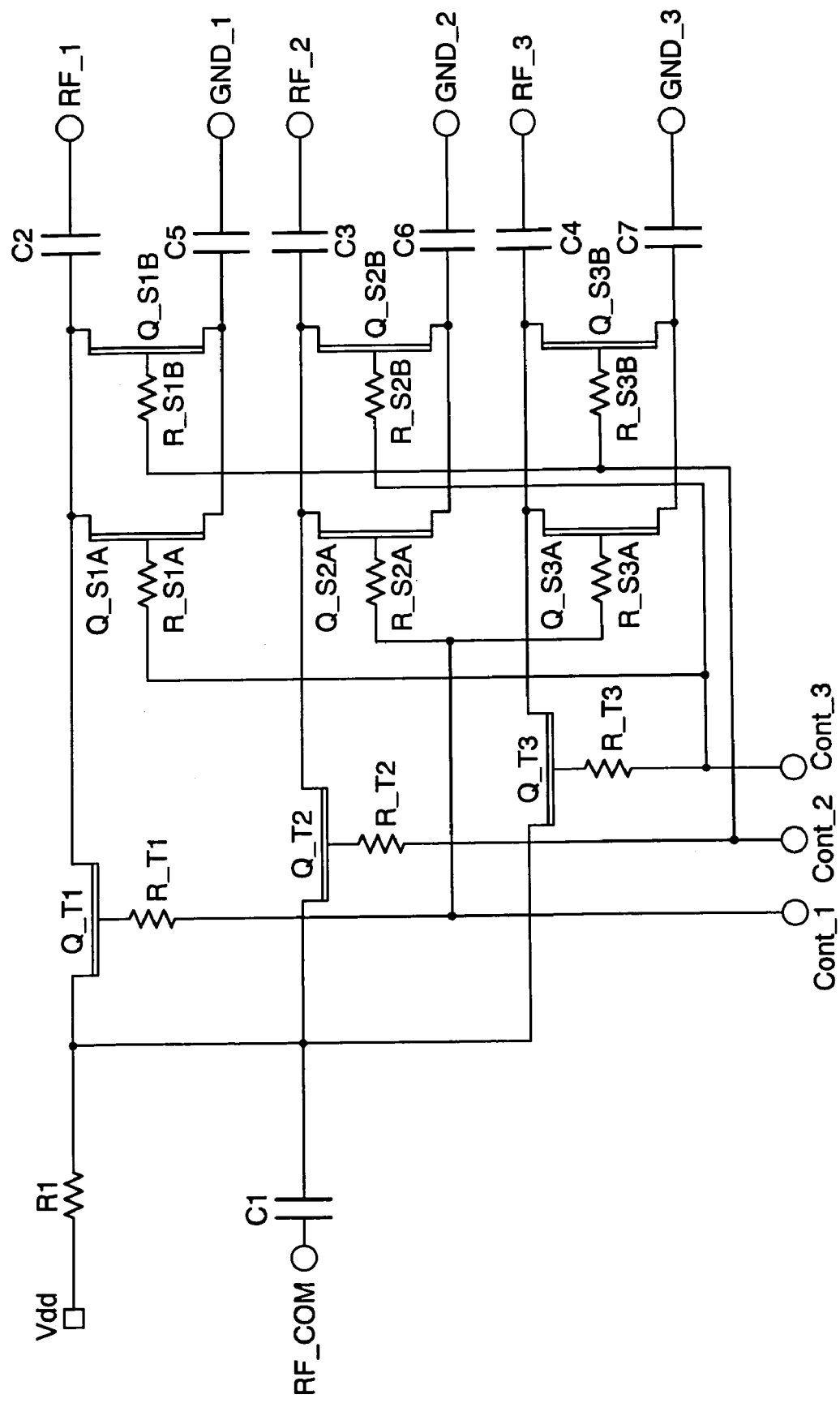
FIG. 6 is a circuit diagram showing the arrangement of a semiconductor switching circuit according to a modification of the second embodiment of the present invention.

Also, as a modification of the second embodiment in which the capacitors C1 to C7 for removing the DC component are formed, it is also possible, as shown in FIG. 6, to newly form a power supply terminal Vdd, and connect a resistive element R1 having a resistance value by which no RF signals leak, between the power supply terminal Vdd and internal signal lines (the sources or drains of through FETs Q_T1 to Q_T3), thereby setting the DC potential of internal signals at a desired power supply voltage Vdd.

Figure 7:
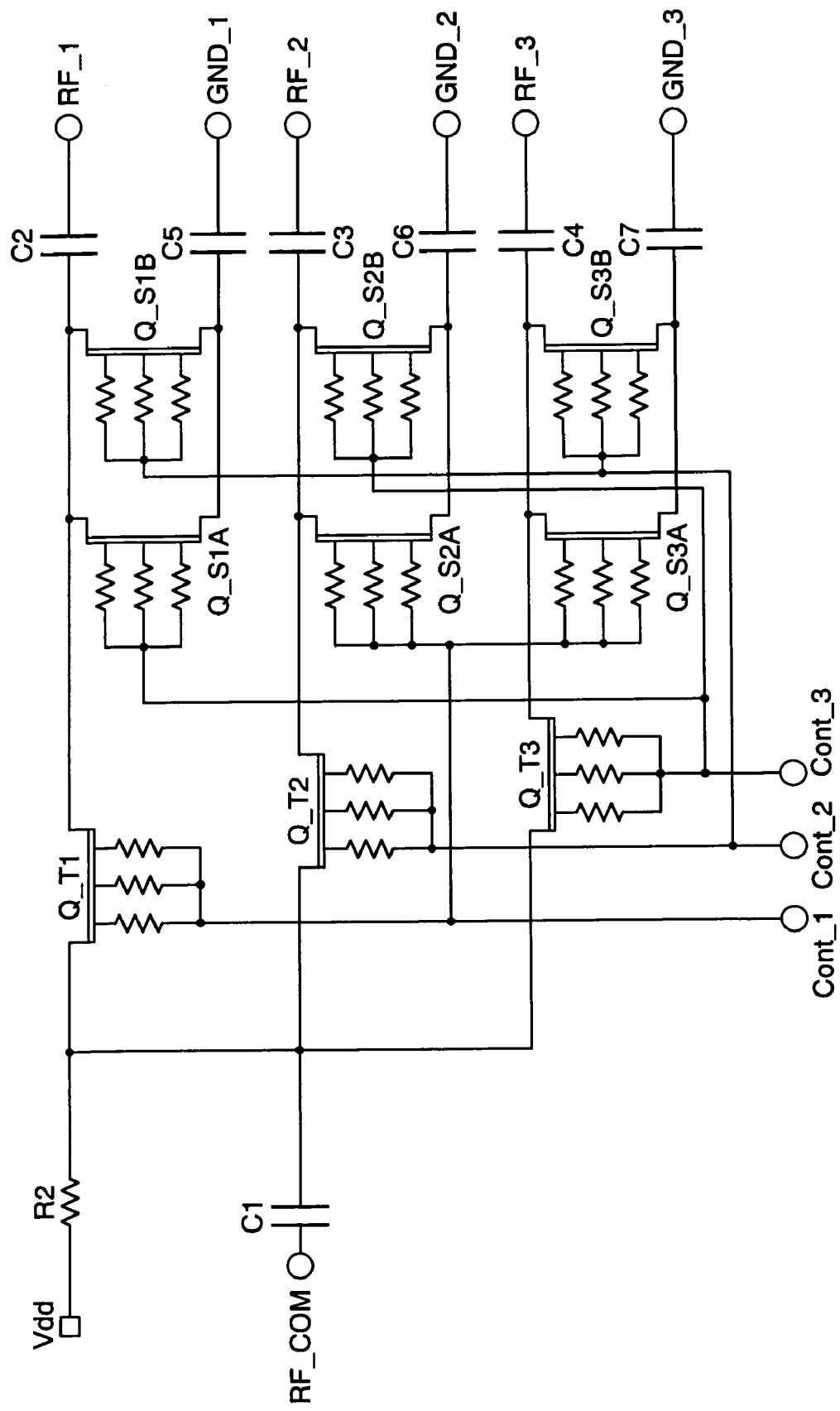
FIG. 7 is a circuit diagram showing the arrangement of a semiconductor switching circuit according to a modification of the third embodiment of the present invention.

Similarly, as a modification of the third embodiment, it is also possible, as shown in FIG. 7, to newly form a power supply terminal Vdd, and connect a resistive element R2 having a resistance value by which no RF signals leak, between the power supply terminal Vdd and internal signal lines (the sources or drains of through FETS Q_T1 to Q_T3), thereby setting the DC potential of internal signals at a desired power supply voltage Vdd. The same effects as in the first to fourth embodiments described above can be achieved in this modification as well.

Furthermore, to improve the RF characteristics, the through FETs and shunt FETs in the above embodiments are desirably FETs formed on a compound semiconductor substrate.

What is claimed is:

1. A semiconductor switching circuit comprising:
   a common terminal;
   first, second, and third terminals;
   first, second, and third ground terminals;
   first, second, and third control terminals;
   a first through FET having a source and drain connected in series between said common terminal and first terminal, and a gate connected to said first control terminal via a first resistor;
   a second through FET having a source and drain connected in series between said common terminal and second terminal, and a gate connected to said second control terminal via a second resistor;
   a third through FET having a source and drain connected in series between said common terminal and third terminal, and a gate connected to said third control terminal via a third resistor;
   11th and 12th shunt FETs each having a source and drain connected in parallel between said first terminal and first ground terminal;
   21st and 22nd shunt FETs each having a source and drain connected in parallel between said second terminal and second ground terminal; and
   31st and 32nd shunt FETs each having a source and drain connected in parallel between said third terminal and third ground terminal,
   wherein gates of said 11th and 22nd shunt FETs are connected to said third control terminal via 11th and 22nd resistors, respectively,
   gates of said 21st and 31st shunt FETs are connected to said first control terminal via 21st and 31st resistors, respectively,
   gates of said 12th and 32nd shunt FETs are connected to said second control terminal via 12th and 32nd resistors, respectively, and
   when a first electric potential is supplied only to a Jth (J is a natural number of 1 to 3) control terminal, and a second electric potential lower than the first electric potential is supplied to the rest of said control terminals,
   said common terminal and a Jth terminal are electrically connected, and
   said first to third terminals except for said Jth terminal and said common terminal are electrically disconnected.

2. A circuit according to claim 1, wherein each of said first to third through FETs and 11th and 12th, 21st and 22nd, and 31st and 32nd shunt FETs is a multi-gate FET having a plurality of gates.

3. A circuit according to claim 1, further comprising:
   a first capacitor connected between said common terminal and the sources or drains of said first to third through FETs;
   a (1A)th capacitor connected between said first terminal and the source or drain of said 12th FET;
   a (2A)th capacitor connected between said second terminal and the source or drain of said 22nd FET;
   a (3A)th capacitor connected between said third terminal and the source or drain of said 32nd FET;
   a (1B)th capacitor connected between said first ground terminal and the drain or source of said 12th FET;
   a (2B)th capacitor connected between said second ground terminal and the drain or source of said 22nd FET; and
   a (3B)th capacitor connected between said third ground terminal and the drain or source of said 32nd FET.

4. A circuit according to claim 1, further comprising a power supply terminal connected, via a resistive element, to a connecting point between the sources or drains of said first to third through FETs and said common terminal.

5. A switch according to claim 1, wherein said first to third through FETs and 11th and 12th, 21st and 22nd, and 31st and 32nd shunt FETs are FETs formed on a compound semiconductor substrate.

6. A circuit according to claim 2, further comprising:
   a first capacitor connected between said common terminal and the sources or drains of said first to third through FETs;
   a (1A)th capacitor connected between said first terminal and the source or drain of said 12th FET;
   a (2A)th capacitor connected between said second terminal and the source or drain of said 22nd FET;
   a (3A)th capacitor connected between said third terminal and the source or drain of said 32nd FET;
   a (1B)th capacitor connected between said first ground terminal and the drain or source of said 12th FET;
   a (2B)th capacitor connected between said second ground terminal and the drain or source of said 22nd FET; and
   a (3B)th capacitor connected between said third ground terminal and the drain or source of said 32nd FET.

7. A circuit according to claim 2, further comprising a power supply terminal connected, via a resistive element, to a connecting point between the sources or drains of said first to third through FETs and said common terminal.

8. A switch according to claim 2, wherein said first to third through FETs and 11th and 12th, 21st and 22nd, and 31st and 32nd shunt FETs are FETs formed on a compound semiconductor substrate.

9. A semiconductor switching circuit comprising:
   a common terminal;
   first, second, jth (j is an integer of 3 to n−1), and nth (n is an integer of not less than 3) terminals;
   first, second, jth, and nth ground terminals;
   first, second, jth, and nth control terminals;
   a first through FET having a source and drain connected in series between said common terminal and first terminal, and a gate connected to said first control terminal via a first resistor;
   a second through FET having a source and drain connected in series between said common terminal and second terminal, and a gate connected to said second control terminal via a second resistor;

a jth through FET having a source and drain connected in series between said common terminal and jth terminal, and a gate connected to said jth control terminal via a jth resistor;

an nth through FET having a source and drain connected in series between said common terminal and nth terminal, and a gate connected to said nth control terminal via an nth resistor;

11th, 12th, (1j)th, and (1(n−1))th shunt FETs each having a source and drain connected in parallel between said first terminal and first ground terminal;

21st, 22nd, (2j)th, and (2(n−1))th shunt FETs each having a source and drain connected in parallel between said second terminal and second ground terminal;

(j1)th, (j2)th, (jj)th, and (j(j−1))th FETs each having a source and drain connected in parallel between said jth terminal and jth ground terminal; and (n1)th, (n2)th, (nj)th, and (n(n−1))th FETs each having a source and drain connected in parallel between said nth terminal and nth ground terminal, wherein gates of said 11th to (1(n−1))th shunt FETs are connected to said second to nth control terminals except for said first control terminal via 11th to (1(n−1))th resistors, respectively, gates of said 21st to (2(n−1))th shunt FETs are connected to said first and third to nth control terminals except for said second control terminal via 21st to (2(n−1))th resistors, respectively, gates of said (n1)th to (n(n−1))th shunt FETs are connected to said first to (n−1)th control terminals except for said nth control terminal via (n1)th to (n(n−1))th resistors, respectively, and when a first electric potential is supplied only to a kth (k is an integer of 1 to n) control terminal, and a second electric potential lower than the first electric potential is supplied to the rest of said control terminals, said common terminal and a kth terminal are electrically connected, and said first to nth terminals except for said kth terminal and said common terminal are electrically disconnected.

10. A circuit according to claim 9, wherein each of said first to nth through FETs and 11th to (1(n−1))th, 21st to (2(n−1))th, (j1)th to (j(j−1))th, and (n1)th to (n(n−1))th shunt FETs is a multi-gate FET having a plurality of gates.

11. A circuit according to claim 9, further comprising:
a first capacitor connected between said common terminal and the sources or drains of said first to nth through FETs;
a (1A)th capacitor connected between said first terminal and the source or drain of said (1(n−1))th FET;
a (2A)th capacitor connected between said second terminal and the source or drain of said (2(n−1))th FET;
a (jA)th capacitor connected between said jth terminal and the source or drain of said (j(j−1))th FET;
an (nA)th capacitor connected between said nth terminal and the source or drain of said (n(n−1))th FET;
a (1B)th capacitor connected between said first ground terminal and the drain or source of said (1(n−1))th FET;
a (2B)th capacitor connected between said second ground terminal and the drain or source of said (2(n−1))th
a (jB)th capacitor connected between said jth ground terminal and the drain or source of said (j(j−1))th FET; and
an (nB)th capacitor connected between said nth ground terminal and the drain or source of said (n(n−1))th FET.

12. A circuit according to claim 9, further comprising a power supply terminal connected, via a resistive element, to a connecting point between the sources or drains of said first to nth through FETs and said common terminal.

13. A circuit according to claim 9, wherein said first to nth through FETs and 11th to (1(n−1))th, 21st to (2(n−1))th, and (j1)th to (j(j−1))th, and (n1)th to (n(n−1))th shunt FETs are FETs formed on a compound semiconductor substrate.

14. A circuit according to claim 10, further comprising:
a first capacitor connected between said common terminal and the sources or drains of said first to nth through FETs;
a (1A)th capacitor connected between said first terminal and the source or drain of said (1(n−1))th FET;
a (2A)th capacitor connected between said second terminal and the source or drain of said (2(n−1))th FET;
a (jA)th capacitor connected between said jth terminal and the source or drain of said (j(j−1))th FET;
an (nA)th capacitor connected between said nth terminal and the source or drain of said (n(n−1))th FET;
a (1B)th capacitor connected between said first ground terminal and the drain or source of said (1(n−1))th FET;
a (2B)th capacitor connected between said second ground terminal and the drain or source of said (2(n−1))th FET;
a (jB)th capacitor connected between said jth ground terminal and the drain or source of said (j(j−1))th FET; and
an (nB)th capacitor connected between said nth ground terminal and the drain or source of said (n(n−1))th FET.

15. A circuit according to claim 10, further comprising a power supply terminal connected, via a resistive element, to a connecting point between the sources or drains of said first to nth through FETs and said common terminal.

16. A circuit according to claim 10, wherein said first to nth through FETs and 11th to (1(n−1))th, 21st to (2(n−1))th, and (j1)th to (j(j−1))th, and (n1)th to (n(n−1))th shunt FETs are FETs formed on a compound semiconductor substrate.

* * * * *